(12) United States Patent
Campedelli et al.

(10) Patent No.: US 9,388,038 B2
(45) Date of Patent: Jul. 12, 2016

(54) MICRO-ELECTRO-MECHANICAL DEVICE WITH BURIED CONDUCTIVE REGIONS, AND MANUFACTURING PROCESS THEREOF

(71) Applicant: STMicroelectronics S.r.l., Agrate Brianza (IT)

(72) Inventors: Roberto Campedelli, Novate Milanese (IT); Raffaella Pezzuto, Surbo (IT); Stefano Losa, Cornaredo (IT); Marco Mantovani, Lainate (IT); Mikel Azpeitia Urquia, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 78 days.

(21) Appl. No.: 14/265,116

(22) Filed: Apr. 29, 2014

(65) Prior Publication Data

US 2014/0231938 A1  Aug. 21, 2014

Related U.S. Application Data

(63) Continuation-in-part of application No. PCT/IB2012/056021, filed on Oct. 30, 2012.

(30) Foreign Application Priority Data

Oct. 31, 2011  (IT) .............. TO2011A0995

(51) Int. Cl.
*H01L 29/84* (2006.01)
*B81B 7/00* (2006.01)
(Continued)

(52) U.S. Cl.
CPC ............. *B81B 7/0006* (2013.01); *B81B 3/0086* (2013.01); *B81B 7/007* (2013.01);
(Continued)

(58) Field of Classification Search
CPC ...... H01L 29/84; B81B 7/0006; B81B 7/007; B81B 3/0086; B81B 2207/097; B81C 1/00476
See application file for complete search history.

(56) References Cited

U.S. PATENT DOCUMENTS 5,554,434 A  9/1996 Park et al.
5,654,219 A  8/1997 Huber
(Continued)

FOREIGN PATENT DOCUMENTS

CN  1856440 A  11/2006
CN  1914115 A  2/2007
(Continued)

OTHER PUBLICATIONS

Murarka, "Refractory silicides for integrated circuits," *J. Vac. Sci. Technol.* 17(4):775-792, 1980.
(Continued)

*Primary Examiner* — Michele Fan
(74) *Attorney, Agent, or Firm* — Seed Intellectual Property Law Group PLLC

(57) ABSTRACT

A MEMS device formed by a body; a cavity, extending above the body; mobile and fixed structures extending above the cavity and physically connected to the body via anchoring regions; and electrical-connection regions, extending between the body and the anchoring regions and electrically connected to the mobile and fixed structures. The electrical-connection regions are formed by a conductive multilayer including a first semiconductor material layer, a composite layer of a binary compound of the semiconductor material and of a transition metal, and a second semiconductor material layer.

25 Claims, 4 Drawing Sheets

(51) Int. Cl.
*B81B 3/00* (2006.01)
*B81C 1/00* (2006.01)

(52) U.S. Cl.
CPC ............ *B81C1/00476* (2013.01); *H01L 29/84* (2013.01); *B81B 2201/0235* (2013.01); *B81B 2201/0242* (2013.01); *B81B 2207/07* (2013.01); *B81B 2207/097* (2013.01)

(56) References Cited

U.S. PATENT DOCUMENTS

| | | | | |
|---|---|---|---|---|
| 5,804,499 | A * | 9/1998 | Dehm | H01L 21/28061 257/E21.2 |
| 6,011,284 | A * | 1/2000 | Katori | H01L 21/76841 257/295 |
| 6,013,951 | A * | 1/2000 | Ishida | H01L 23/5226 257/621 |
| 6,020,641 | A * | 2/2000 | Lee | H01L 23/53271 257/755 |
| 6,458,693 | B1 | 10/2002 | Park et al. | |
| 7,422,928 | B2 | 9/2008 | Oka et al. | |
| 7,683,429 | B2 * | 3/2010 | Yamaguchi | B81C 1/00142 257/347 |
| 8,455,996 | B1 * | 6/2013 | Chen | B81C 1/00269 257/698 |
| 8,552,512 | B2 | 10/2013 | Inaba et al. | |
| 8,980,668 | B2 | 3/2015 | Lutz et al. | |
| 2002/0180031 | A1 * | 12/2002 | Yamaguchi | B81B 7/0064 257/704 |
| 2004/0119899 | A1 * | 6/2004 | Miyazaki | G02F 1/136227 349/38 |
| 2004/0245581 | A1 * | 12/2004 | Tsuchiaki | H01L 21/28061 257/382 |
| 2006/0275968 | A1 * | 12/2006 | Mantl | H01L 21/26506 438/197 |
| 2006/0284183 | A1 * | 12/2006 | Izumi | B81C 1/00246 257/75 |
| 2007/0037311 | A1 * | 2/2007 | Izumi | B81C 1/00404 438/53 |
| 2007/0249082 | A1 * | 10/2007 | Hanaoka | B81C 1/00246 438/53 |
| 2008/0076211 | A1 * | 3/2008 | Casset | B81C 1/0065 438/127 |
| 2010/0148341 | A1 * | 6/2010 | Fuji | B81B 7/007 257/686 |
| 2010/0181676 | A1 * | 7/2010 | Montez | B81C 1/00269 257/771 |
| 2010/0193884 | A1 * | 8/2010 | Park | B81C 1/00269 257/414 |
| 2010/0237446 | A1 | 9/2010 | Freidhoff | |
| 2010/0244160 | A1 * | 9/2010 | Kanemoto | G01P 15/0802 257/415 |
| 2010/0307247 | A1 * | 12/2010 | Weber | B81B 3/0078 73/514.29 |
| 2012/0205753 | A1 * | 8/2012 | Adams | B81B 3/0008 257/415 |

FOREIGN PATENT DOCUMENTS

| | | |
|---|---|---|
| CN | 101164863 A | 4/2008 |
| CN | 102180436 A | 9/2011 |
| EP | 1 914 195 A2 | 4/2008 |
| EP | 2 011 762 A2 | 1/2009 |
| TW | 432616 B | 5/2001 |

OTHER PUBLICATIONS

Qin et al., "A study of nickel silicide film as a mechanical material," *Sensors and Actuators* 87:90-95, 2000.

Li Z. et al., "Study on the application of silicide in surface micromachining", J. Micromech. Microeng. 12 (2002), pp. 162-167.

* cited by examiner

MICRO-ELECTRO-MECHANICAL DEVICE WITH BURIED CONDUCTIVE REGIONS, AND MANUFACTURING PROCESS THEREOF

BACKGROUND

1. Technical Field

The present disclosure relates to a micro-electro-mechanical (MEMS) device with buried conductive regions and to the manufacturing process thereof.

2. Description of the Related Art

As is known, MEMS devices comprise a structural layer having regions that extend over a cavity or air gap and define suspended structures mobile in a direction parallel or transverse with respect to the top surface of a support, for example a substrate of semiconductor material, extending underneath the structural layer.

The suspended structures may be obtained with various machining techniques, such as surface micromachining, including defining the structures in the structural layer and removing a sacrificial layer formed on top of the substrate.

Frequently, the suspended structures, as other fixed structures facing the suspended structures, are anchored to the substrate via anchoring and support regions. These anchoring and support regions also enable electrical connection of the suspended or fixed structures to other parts of the device or to the outside world, for their electrical biasing and reading variable electrical quantities generated by the movement of the mobile structures.

In this case, the electrical-connection structures are formed by buried regions including conductive interconnection lines, which extend underneath the cavity, are supported by the substrate, and are typically electrically insulated from the latter by an insulating layer, when the substrate is of semiconductor material.

The conductive interconnection lines may be advantageously made of semiconductor material, typically doped polysilicon.

For example, a process used by the applicant for producing silicon inertial sensors and actuators includes providing buried interconnection lines of polycrystalline silicon (also referred to as polysilicon) arranged on a substrate, doped in situ, forming a sacrificial oxide layer, typically by plasma-enhanced chemical-vapor deposition (PECVD), and forming the structural layer by growth, using an epitaxial technique, of a thick polysilicon layer.

This technology enables forming suspended structures of a large thickness, which are able to move in a plane parallel to the surface of the substrate and/or in a direction transverse to the plane. The achievable large thickness enables extensive vertical surfaces to be obtained and thus high total capacitances, and high robustness, sensitivity and reliability.

In these types of devices, the final resistivity of the interconnections strictly depends upon the layout, the thickness, the process deposition parameters, and the sequence of the thermal-process steps and has a marked impact on the electrical behavior of the finished MEMS device in terms of signal-to-noise ratio.

In particular, to obtain a high signal-to-noise ratio, it is expedient to provide buried interconnection lines having a low resistance. To this end, it is known to dope the deposited polycrystalline material. For example, a thermal-doping step with $POCl_3$ or an ion implantation may be carried out. In this way, resistivities on the order of 0.4-1.5 mΩ·cm are obtained. The ion-implantation technique is, however, relatively costly and does not enable sufficiently low resistivities to be achieved. The doping with $POCl_3$, on the other hand, enables resistivities to be achieved that are lower as compared to the implantation technique but are still not sufficient. In addition, the technique is relatively far from uniform and less commonly used in processes on substrates with a diameter greater than 150 mm.

In order to obtain a high conductivity of the buried interconnection lines, it has also already been proposed to use a silicidation technique, including forming a metal silicon layer on top of the interconnection lines, a technique already known and applied in integrated circuits and in memory systems.

For example, Zhihong L. et al. "Study on the application of silicide in surface micromachining", J. Micromech. Microeng. 12 (2002), pp. 162-167 describes a technique for forming silicidized interconnection lines in MEMS devices. In particular, this article describes a self-aligned technique, whereby a polysilicon layer is provided, is implanted and subjected to annealing, a metal layer, typically cobalt, is deposited, and the resulting wafer is subject to rapid thermal annealing (RTA) so that silicide forms where the polysilicon interconnection lines are present. The metal that has not reacted is removed via a hydrochloric acid solution, and the process proceeds with the steps for forming the fixed and mobile structures of the device.

The above known solution may, however, be improved since cobalt silicide does not have a sufficient resistance to the hydrofluoric acid used for releasing the mobile structures and degrades at the high temperatures that are typically utilized for the growth of the structural layer, thus nullifying the advantages that may be achieved. In addition, this solution cannot be integrated easily with current manufacturing processes.

BRIEF SUMMARY

According to the present disclosure, there is provided a micro-electro-mechanical device with buried conductive regions and a manufacturing process thereof.

In one embodiment there is provided a micro-electro-mechanical device that includes electrical-connection regions extending on a substrate, underneath a cavity that are formed by a conductive multilayer comprising a first semiconductor material layer, such as polycrystalline silicon, a composite layer of a binary compound of the semiconductor material and a transition metal, such as a tungsten silicide, and a second semiconductor material layer, such as polycrystalline silicon.

BRIEF DESCRIPTION OF THE SEVERAL VIEWS OF THE DRAWINGS

For a better understanding of the present disclosure some embodiments thereof are now described, purely by way of non-limiting example, with reference to the attached drawings, wherein.

DETAILED DESCRIPTION

Figure 1A:
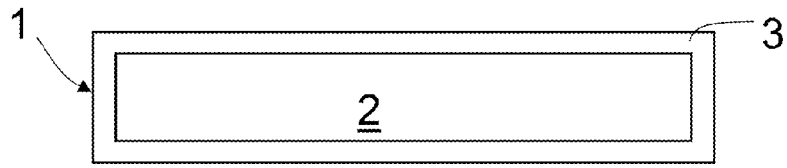
FIGS. 1A-1F are cross-sections of a wafer of semiconductor material in intermediate successive steps of a first embodiment of the present method.

FIGS. 1A-1F refer to a first embodiment. In detail, FIG. 1A shows a wafer 1 of semiconductor material, which includes a substrate 2, typically of silicon, after this has undergone a thermal oxidation at high temperature. Consequently, the substrate 2 is coated on all its sides with an insulating layer 3, typically permanent oxide with a thickness of 2.6 µm. The insulating layer 3 has the function of reducing the parasitic capacitance towards the substrate.

Figure 1B:
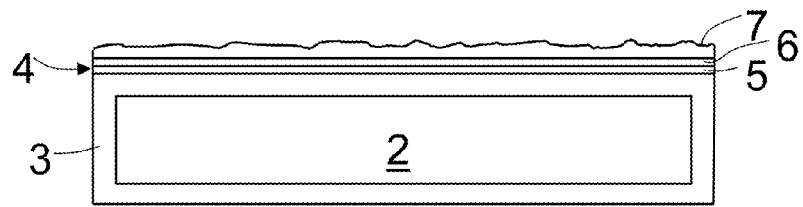

As shown in FIG. 1B, a multilayer 4 is deposited. To this end, first of all a first polycrystalline silicon layer (poly1, 5) is laid on the insulating layer 3. The poly1 layer 5 may be doped or not doped and has a thickness, for example, between 100 nm and 300 nm. A silicide layer 6, for example tungsten silicide, is deposited by CVD for a thickness, for example, between 100 and 400 nm. For the deposition of the silicide layer 6, it is possible to use two different chemical processes: reaction between $WF_6$ and silane ($SiH_4$) and reaction between $WF_6$ and dichlorosilane ($SiH_2Cl_2$). In particular, the reactions that take place during deposition are:

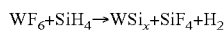

$$WF_6+SiH_4 \rightarrow WSi_x+SiF_4+H_2$$

or

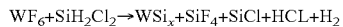

$$WF_6+SiH_2Cl_2 \rightarrow WSi_x+SiF_4+SiCl+HCL+H_2$$

The final stoichiometry (defined as the ratio between silicon atoms and tungsten atoms) is 2.2-2.8 or more, in the case of use of silane, and 1.3-2.7, in the case of dichlorosilane.

The thermal energy used for the reaction is supplied via a susceptor.

A second polycrystalline silicon layer (poly2, 7) is deposited. The poly2 layer 7 is, for example, doped in situ with phosphorus and has a thickness, for example, between 400 nm and 900 nm. The deposition of the poly2 layer 7 may be controlled so to have a preset roughness, as discussed in greater detail hereinafter.

Figure 1C:
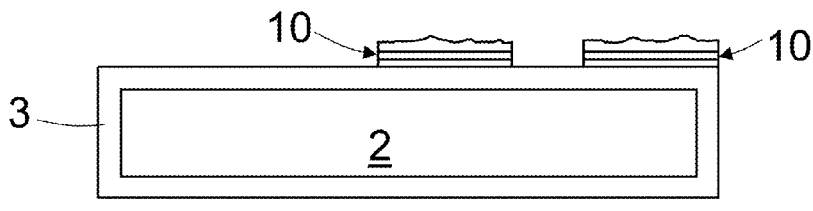

As shown in FIG. 1C, the multilayer 4 is defined, via lithography and etching, so as to form conductive regions 10 that are to form anchorages and interconnection lines. The conductive regions 10 thus formed are subject to thermal annealing, via RTP treatment, at 900° C. in $N_2$ or $N_2/O_2$ environment. Annealing enables the silicide layer 6, deposited in an amorphous layer, to crystallize and thus reach low resistivity.

Figure 1D:
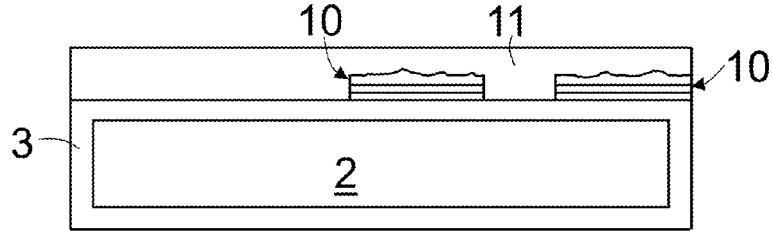
Figure 1E:
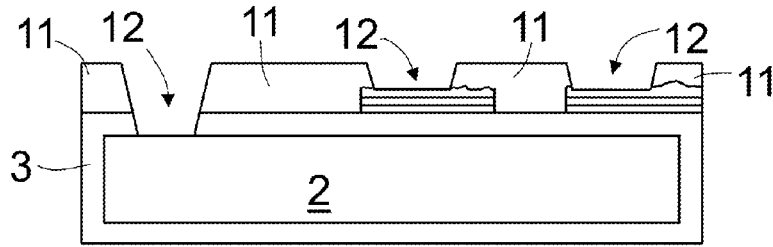
Figure 1F:
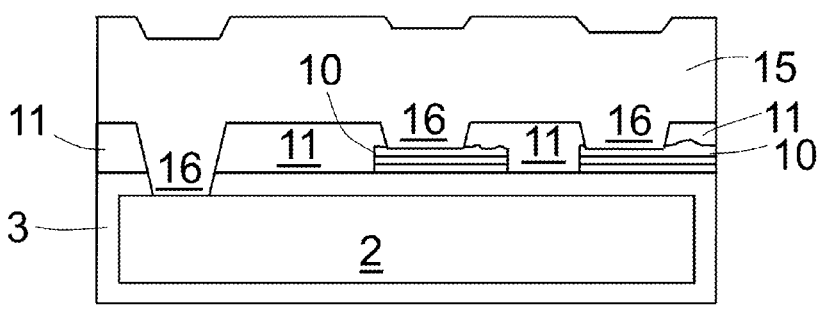

Standard process steps follow, including: depositing a sacrificial layer 11, for example oxide deposited by plasma-enhanced chemical-vapor deposition (PECVD) for a thickness, for example, between 0.8 and 2 µm, typically 1.6 µm (FIG. 1D); forming trenches 12 through the sacrificial layer 11 so as to expose part of the conductive regions 10 and, if desired, of the substrate 2 (FIG. 1E); and growing a structural layer 15 in an epitaxial reactor until a thickness, for example, between 15 and 40 µm, is obtained (FIG. 1F). The structural layer 15 may be doped in situ or with other conventional doping techniques ($POCl_3$) and forms columns 16 that fill the trenches 12 and are to form the anchorages and connection portions for the mobile and fixed structures of the final MEMS device.

Figure 3:
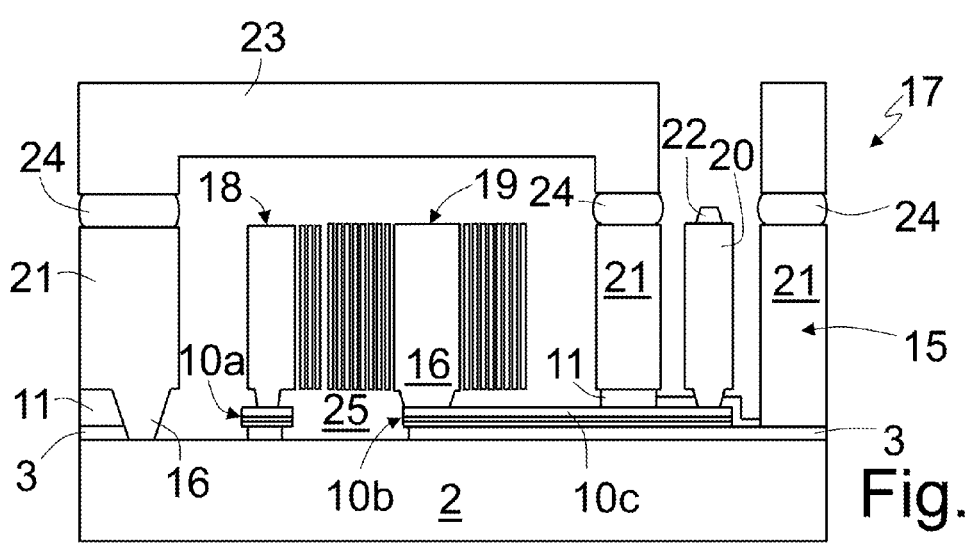
FIG. 3 shows a cross-section of a MEMS device.
Figure 4:
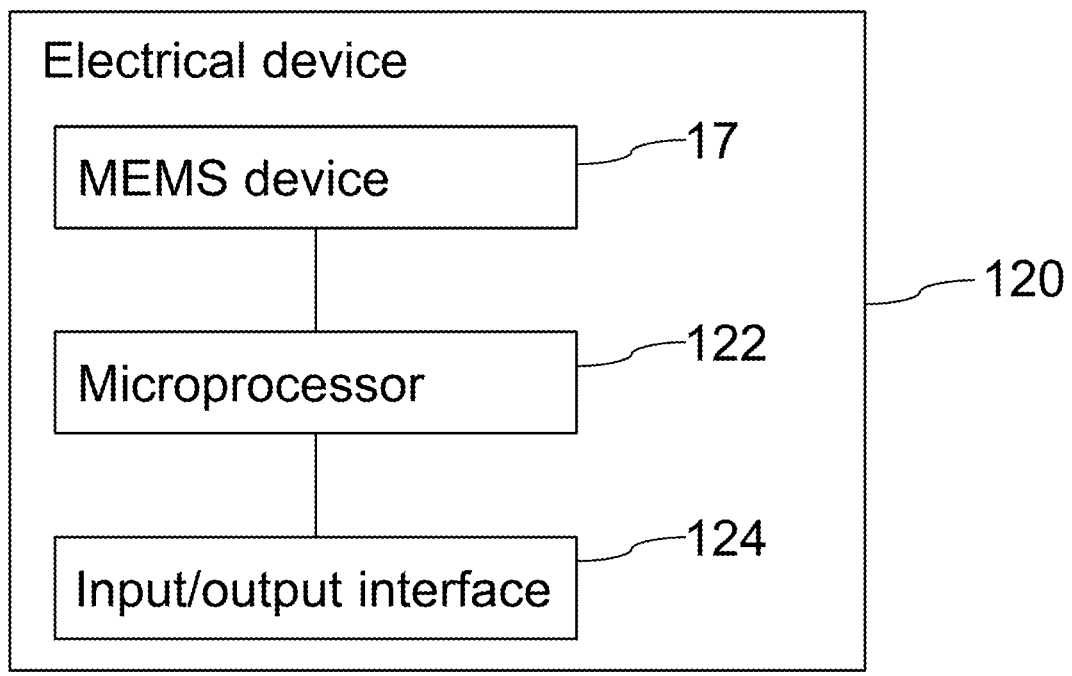
FIG. 4 is a block diagram of an electronic device that includes a MEMS device in accordance with an embodiment.

The steps of defining the mobile and fixed structures of the MEMS device are performed so as to form (see FIG. 3) a stator 18, a rotor 19, a contact column 20, and walls 21. Definition is obtained, in a per se known manner, via a deep silicon etching, which is performed through the whole thickness of the structural layer 15. The process proceeds with providing a contact metallization 22, above the contact column 20, freeing the structure, by etching and removing the sacrificial layer 11 underneath the mobile and fixed structures 18, 19, using HF in vapor phase, to form a cavity 25, and further final machining and bonding to a cap 23 via soldering material 24 of a conductive or insulating type. The wafer is diced to obtain a plurality of MEMS devices 17. In the MEMS device 17 of FIG. 3, two conductive regions 10 are visible, a first one whereof forming an anchor 10a for the stator 18, and a second forming an anchor 10b for the rotor 19, as well as an interconnection line 10c for electrical connection of the latter.

FIGS. 2A-2I show successive process steps of an embodiment wherein the sides of the conductive regions 10 are sealed by spacers. This solution may be usefully applied to particular products for which it is useful to laterally protect the conductive regions 110 from process steps that might damage the silicide layer 6, for example, plasma treatments in oxygen atmosphere. The embodiment of FIGS. 2A-2I comprises some steps that are the same as those of FIGS. 1A-1F. Consequently, the parts that are in common are designated by the same reference numbers and for the relevant detailed description reference is made to the above.

Figure 2A:
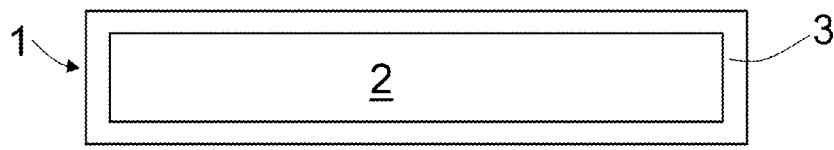
FIGS. 2A-2I are cross-sections of a wafer of semiconductor material in intermediate successive steps of a second embodiment of the present method.
Figure 2B:
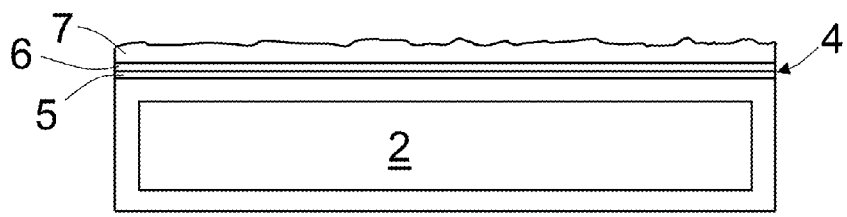

In detail (FIG. 2A), as described with reference to FIG. 1A, initially a wafer 1 of semiconductor material including a substrate 2 is subject to a thermal oxidation to provide an insulating layer 3. As shown in FIG. 2B and as described with reference to FIG. 1B, a multilayer 4 is deposited, comprising a first polycrystalline silicon layer (poly1, 5), a silicide layer 6, and a second polycrystalline silicon layer (poly2, 7). These steps may be carried out using the same techniques and parameters as described above.

Figure 2C:
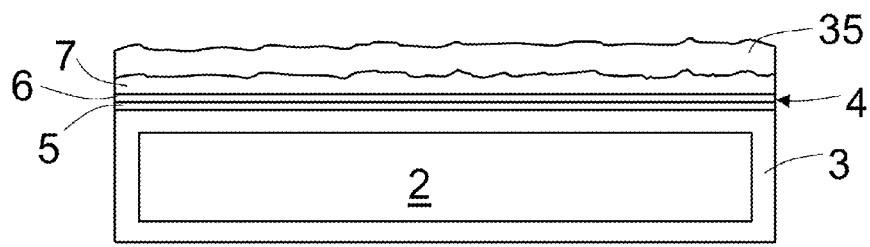
Figure 2D:
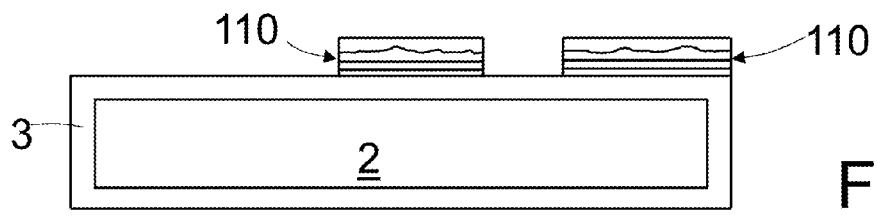

As shown in FIG. 2C, the poly2 layer 7 is subject to thermal oxidation at a temperature of, for example, 900° C., so as to form an oxide layer 35 on the multilayer 4.

The multilayer 4 and the oxide layer 35 are defined (FIG. 2D) via a lithography and etching step so as to form conductive regions 110, similar to the conductive regions 10 of FIG. 1C. The conductive regions 110 thus formed are subject to rapid thermal annealing, via an RTP treatment, at 900° C. in $N_2$ environment.

Figure 2E:
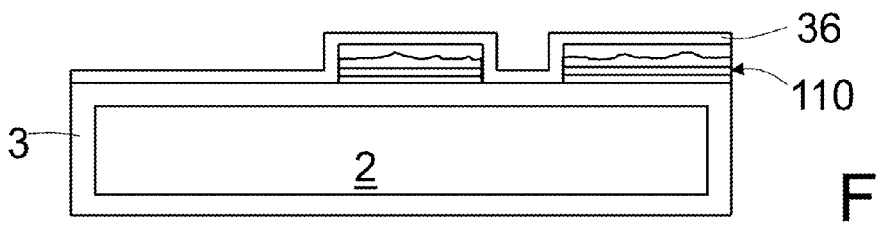

As shown in FIG. 2E, a protective layer 36 is deposited and coats the conductive regions 110 and the top surface of the insulating layer 3. For example, the protective layer 36 may be of polycrystalline silicon deposited by LPCVD and have a thickness of approximately 100-300 nm.

Figure 2F:
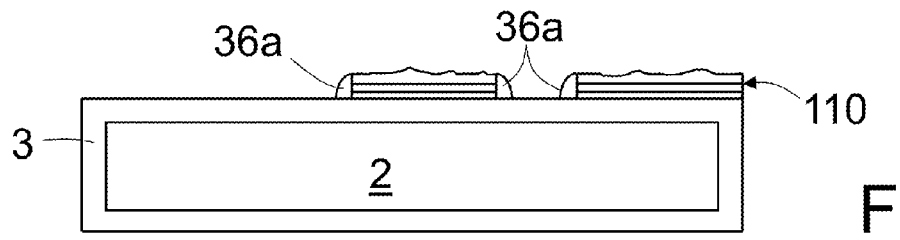
Figure 2G:
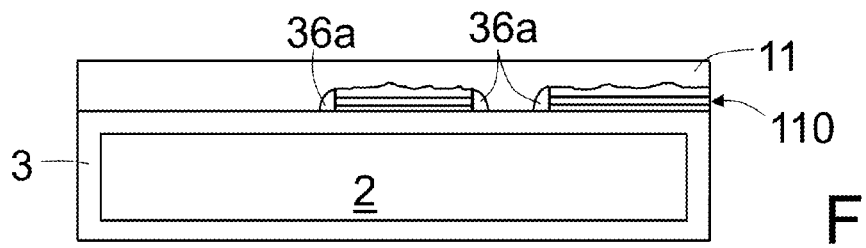
Figure 2H:
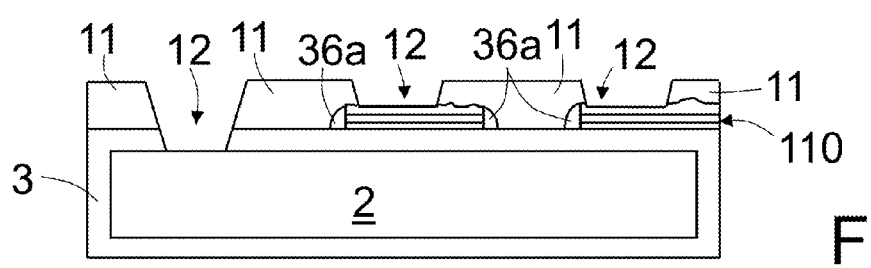

The protective layer 36 is subject to etch back, i.e., to a non-masked anisotropic etch, which removes the horizontal portions thereof and leaves protection regions 36a on the sides of the conductive regions 110 (FIG. 2F). Obviously, the protection regions 36a extend also on the non-visible sides of the conductive regions 110, on surfaces not traversed by the drawing plane. Also the remaining portions of the oxide layer 35 are removed.

Figure 2I:
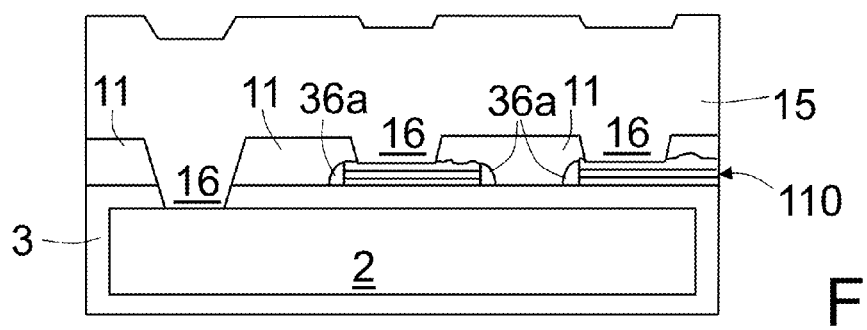

Further steps follow that are similar to those described with reference to FIGS. 1D-1F, comprising: depositing a sacrificial layer 11 (FIG. 2G); providing trenches 12 (FIG. 2H); growing a structural layer 15 and forming columns 16 (FIG. 2I). Finally, the mobile and fixed structures are defined, so as to form the MEMS device 17 of FIG. 3.

Forming the electrical-connection conductive regions 10, 110 as multilayers formed by semiconductor material, binary compound of the semiconductor material and a transition metal, and semiconductor material (here polysilicon-silicide-polysilicon) enables low resistivities to be achieved (down to values lower than 0.03 mΩ·cm in the finished device), with a considerable improvement of the behavior from the standpoint of the signal-to-noise ratio, with particular reference to the thermal noise. The fact of obtaining lower resistances, all the other parameters remaining unvaried, enables reduction of the power consumption in the device, as is particularly desired in the case when the MEMS device is integrated in apparatuses operating at low power and/or for which a long service life is desired.

In addition, the reduction of resistivity that may be obtained enables the dimensions of the interconnections and thus of the device to be reduced, with a reduction of the width of the interconnection lines.

The presence of a top polysilicon layer (poly2 layer 7) enables a conductive layer to be obtained with a modulable roughness linked to the properties of the poly2 layer 7 and such as to eliminate stiction of the mobile parts of the structural layer 15 and protect the silicide layer 7 from the chemical-physical processes during the processing flow of the MEMS device, since the silicide layer is not exposed to the etching for the majority of its surface (with the exclusion of its sides). The embodiment of FIGS. 2A-2I provides, however, a complete protection of the silicide layer 6 when this is desired.

The conductive regions 10, 110 have a roughness that depends upon the characteristics of the poly2 layer 7, the conditions of deposition whereof may thus be controlled also according to the desired final roughness. For example, in tests conducted by the present applicant, it has been possible to obtain root-mean-square values of roughness Rms between 12 and 28 nm, for example Rms=24 nm, and peak-to-peak values Zrange between 120 and 230 nm, for example Zrange=210 nm, thus comparable with the ones achievable in standard processes, without silicide. This is important for the purposes of obtaining good characteristics of resistance to stiction of the finished device 17.

The MEMS device 17 that may thus be obtained may be perfectly integrated in current inertial sensors, gyroscopes, and microactuators. The MEMS device 17 may be located in electrical devices 120, such as cellphones, personal digital assistants, portable computer, camera, etc. The MEMS device 17 is coupled to a microprocessor 122. The microprocessor 122 is coupled to an input/output interface 124. The electrical device 120 may include a power source (not shown) and/or suitable structure for coupling to an external power source.

Finally, it is clear that modifications and variations may be made to the device and to the manufacturing process described and illustrated herein, without thereby departing from the scope of the present disclosure.

For example, the substrate 2 could be of a material different from a semiconductor, such as for example the materials of printed-circuit boards or the like.

In addition, the multilayer may be of other materials, for example silicides of different metals, and/or the parameters of the various steps may be modified.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device comprising:
a body;
a cavity above the body;
first and second anchoring regions;
a mobile structure above the cavity and coupled to the body by the first anchoring regions;
a fixed structure above the cavity and coupled to the body by the second anchoring regions;
first and second electrical-connection regions between the body and the first and second anchoring regions, respectively, the first electrical-connection region being electrically coupled to the mobile structure and the second electrical-connection region being electrically coupled to the fixed structure, wherein the first and second electrical-connection regions have a conductive multilayer that includes a first semiconductor material layer, a composite layer of a binary compound of a semiconductor material and of a transition metal, and a second semiconductor material layer; and
protection regions laterally covering only the sides of the first and second electrical-connection regions.

2. The MEMS device according to claim 1, wherein the first and second semiconductor material layers are of polycrystalline silicon and the composite layer is of silicide.

3. The MEMS device according to claim 2, wherein the silicide is a tungsten silicide.

4. The MEMS device according to claim 1, wherein the first semiconductor material layer has a thickness between about 50 and 400 nm, the composite layer has a thickness between about 50 and 600 nm, and the second semiconductor material layer has a thickness between about 300 and 1200 nm.

5. The MEMS device according to claim 4, wherein the first semiconductor material layer is between 100 and 300 nm, the composite layer is between 100 and 400 nm, and the second semiconductor material layer is between 400 and 900 nm.

6. The MEMS device according to claim 1, wherein the protection regions are polycrystalline silicon.

7. The MEMS device according to claim 1, wherein the first and second electrical-connection regions have a resistivity lower than 0.03 mΩ·cm.

8. The MEMS device according to claim 1, wherein semiconductor material of the binary compound is the same semiconductor material of the first semiconductor material layer.

9. A MEMS device, comprising:
a body;
a cavity above the body;
first and second anchoring regions;
a mobile structure above the cavity and coupled to the body by the first anchoring regions;
a fixed structure above the cavity and coupled to the body by the second anchoring regions; and
first and second electrical-connection regions between the body and the first and second anchoring regions, respectively, the first electrical-connection region being electrically coupled to the mobile structure and the second electrical-connection region being electrically coupled to the fixed structure, wherein the first and second electrical-connection regions have a conductive multilayer that includes a first semiconductor material layer, a composite layer of a binary compound of a semiconductor material and of a transition metal, and a second semiconductor material layer, wherein the first and second electrical-connection regions have a root-mean-square roughness between about 12 and 28.

10. The MEMS device according to claim 9, wherein the first and second electrical-connection regions have a resistivity lower than 0.03 mΩ·cm.

11. The MEMS device according to claim 9, wherein semiconductor material of the binary compound is the same semiconductor material of the first semiconductor material layer.

12. A method for manufacturing a MEMS device, the method comprising:
- over a body, forming an electrical-connection region that includes a first semiconductor material layer, a composite layer of a binary compound of a semiconductor material and of a transition metal, and a second semiconductor material layer on the composite layer, wherein forming the electrical-connection region includes depositing and defining a conductive multilayer, wherein depositing the conductive multilayer includes:
  - depositing the first semiconductor material layer,
  - depositing the composite layer, and
  - depositing the second semiconductor material layer;
- providing a protection region laterally covering only the sides of the electrical-connection region;
- forming a sacrificial layer on the electrical-connection region;
- forming an anchoring opening in the sacrificial layer exposing at least a portion of the electrical-connection region;
- forming a structural layer on the sacrificial layer and in the anchoring opening;
- defining mobile and fixed structures in the structural layer; and
- at least partially removing the sacrificial layer and releasing portions of the mobile and fixed structures.

13. The method according to claim 12, wherein the first and second layers of semiconductor material are polycrystalline silicon and the composite layer is a silicide.

14. The method according to claim 13, wherein the silicide is a tungsten silicide.

15. The method according to claim 12, further comprising after defining the conductive multilayer, performing a thermal annealing treatment at a temperature between about 800° and 1200° C.

16. The method according to claim 12, wherein the semiconductor material of the binary compound is the same semiconductor material of the first semiconductor material layer.

17. The method according to claim 16, wherein the first semiconductor material layer and the second semiconductor layer are made from the same semiconductor material.

18. A method for manufacturing a MEMS device, the method comprising:
- over a body, forming an electrical-connection region that includes a first semiconductor material layer, a composite layer of a binary compound of a semiconductor material and of a transition metal, and a second semiconductor material layer on the composite layer, wherein the first and second layers of semiconductor material are polycrystalline silicon and the composite layer is a silicide, wherein forming the electrical-connection region includes forming the composite layer that includes causing a tungsten fluoride to react with a silane compound;
- forming a sacrificial layer on the electrical-connection region;
- forming an anchoring opening in the sacrificial layer exposing at least a portion of the electrical-connection region;
- forming a structural layer on the sacrificial layer and in the anchoring opening;
- defining mobile and fixed structures in the structural layer; and
- at least partially removing the sacrificial layer and releasing portions of the mobile and fixed structures.

19. The method according to claim 18, wherein the silicide is a tungsten silicide.

20. An electronic device comprising:
- a MEMS that includes:
  - a substrate;
  - a cavity above the substrate;
  - first and second anchoring regions;
  - a mobile structure above the cavity and coupled to the substrate by the first anchoring regions;
  - a fixed structure coupled to the substrate by the second anchoring regions;
  - a first electrical-connection region between the substrate and the first anchoring region and electrically coupled to the mobile structure;
  - a second electrical-connection region between the substrate and the second anchoring region and electrically coupled to the fixed structure, wherein the first and second electrical-connection regions have a conductive multilayer that includes a first semiconductor material layer, a composite layer of a binary compound of a semiconductor material and of a transition metal, and a second semiconductor material layer; and
- protection regions covering only lateral portions of the first and second electrical-connection regions.

21. The electronic device according to claim 20, wherein an insulating layer is between the first and second electrical-connection regions and the substrate.

22. The electronic device according to claim 20, wherein the electronic device is one of a cellphone, a personal digital assistant, a portable computer, a camera.

23. The electronic device according to claim 20, wherein the MEMS device is one of an accelerometer, a gyroscope, and a microactuator.

24. The method according to claim 20, wherein the semiconductor material of the binary compound is the same semiconductor material of the first semiconductor material layer.

25. The method according to claim 20, wherein substrate is one of a semiconductor material and a printed circuit board.

* * * * *